United States Patent [19]
Chen

[11] Patent Number: 6,153,520
[45] Date of Patent: Nov. 28, 2000

[54] METHOD FOR FABRICATING SELF-ALIGNED SILICIDE

[75] Inventor: Tung-Po Chen, Taichung, Taiwan

[73] Assignee: United Microelectronics Corp., Taiwan

[21] Appl. No.: 09/258,117

[22] Filed: Feb. 24, 1999

[51] Int. Cl.[7] .................................................. H01L 21/44
[52] U.S. Cl. ........................................... 438/682; 438/682
[58] Field of Search .................................... 438/582, 583, 438/682, 683, 655, 677, 592, 622, 635, 728; 257/408

[56] References Cited

U.S. PATENT DOCUMENTS

| | | | |
|---|---|---|---|
| 5,856,237 | 1/1999 | Ku | 438/683 |
| 5,994,747 | 11/1999 | Wu | 257/408 |
| 6,015,753 | 1/2000 | Lin et al. | 438/682 |
| 6,022,805 | 2/2000 | Sumi | 438/677 |

*Primary Examiner*—David Nelms
*Assistant Examiner*—David Nhu
*Attorney, Agent, or Firm*—Blakely Sokoloff Taylor & Zafman

[57] ABSTRACT

A method to fabricate a salicide layer is described. The method is performed by forming a metal layer on the polysilicon gate and source/drain region and by a chemical vapor deposition using $TiCl_4$ as a source gas. The metal layer is in situ transformed into a silicide layer in the formation step of the metal layer.

8 Claims, 1 Drawing Sheet

METHOD FOR FABRICATING SELF-ALIGNED SILICIDE

BACKGROUND OF THE INVENTION

1. Field of the Invention

This invention relates to silicide fabrication, and more particularly to a method for fabricating a self-aligned silicide (salicide) layer by chemical vapor deposition.

2. Description of Related Art

At a deep sub-micron level of semiconductor fabrication technologies, line width, contact area, and junction depth are greatly reduced. In order to effectively enhance device performance, reduce device resistance, and reduce device resistance-capacitance (RC) delay, silicide has gradually taken the place of polysilicon to form conductive parts, such as a gate, or interconnects. A silicide layer is usually formed by triggering a reaction between a metallic material and silicon of a substrate through a rapid thermal annealing process. After reaction, a silicide material is thereby formed on a silicon interface of the substrate. The reaction process usually includes an environmental gas, such as nitrogen or argon. The silicide material usually includes titanium silicide, tungsten silicide, cobalt silicide, nickel silicide, molybdenum silicide, or platinum silicide, of which titanium silicide is most widely used because its conductivity is relatively higher and it can be easily controlled in fabrication.

Conventionally, a layer of titanium metal is formed over the silicon substrate by sputtering deposition. A rapid thermal process (RTP) is performed to trigger a reaction between the titanium metal layer and the silicon atoms of the silicon substrate so as to form a titanium salicide layer.

However, as the device dimension is greatly reduced, the quality of the titanium salicide layer may be degraded due to an overly reduced dimension. The overly reduced dimension often causes too much contact stress or too few of nucleation sites, resulting in a variation of the content ratio of titanium salicide, and further resulting in a poor quality of the titanium salicide layer. A sheet resistance is then raised. The operation performance is unavoidably degraded.

SUMMARY OF THE INVENTION

The invention provides a method of fabricating a salicide layer. The method is performed by forming a metal layer on the polysilicon gate and source/drain region and by a chemical vapor deposition using $TiCl_4$ as a source gas. The metal layer is in situ transformed into a silicide layer in the formation step of the metal layer.

One feature of the invention is that of in situ formation of the silicide layer by chemical vapor deposition. Therefore, no additional process and time are needed to react the metal layer with silicon in the substrate. Furthermore, a high quality silicide layer is formed even when the dimensions of the devices are reduced.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
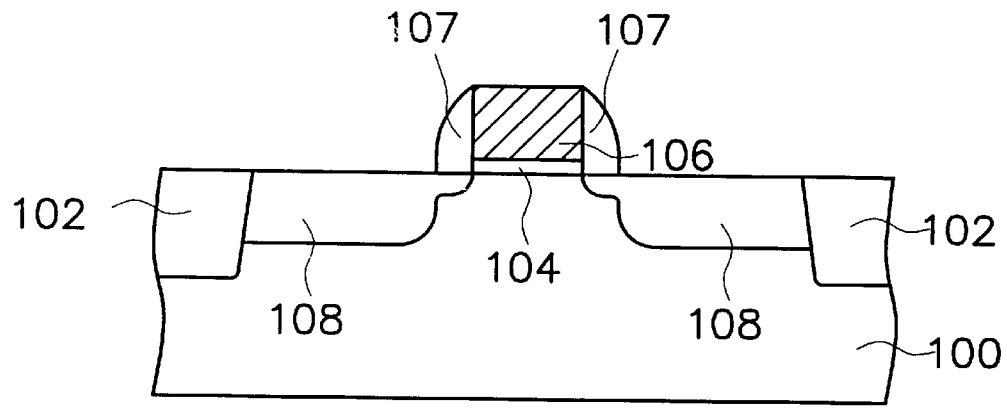
FIGS. 1A–1C are schematic, cross-sectional views showing a method of forming a silicide layer on the substrate according to a preferred embodiment of the invention.
Figure 1B:
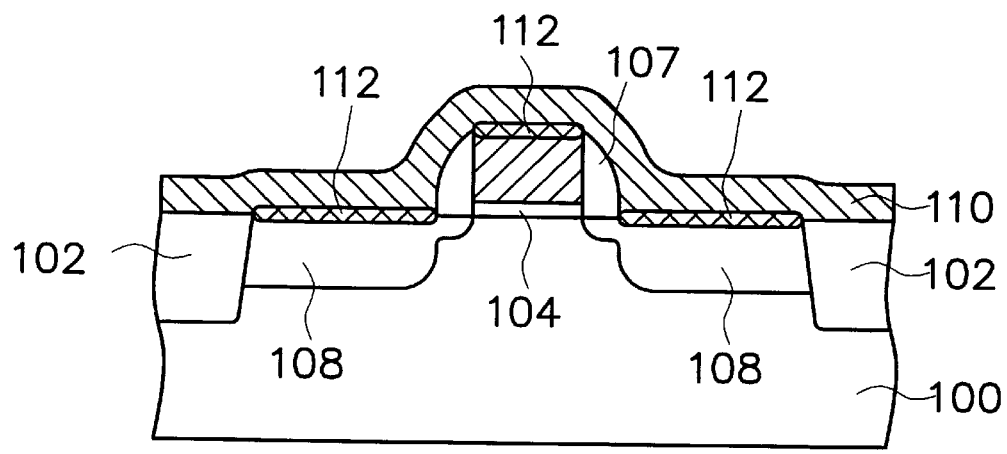
Figure 1C:
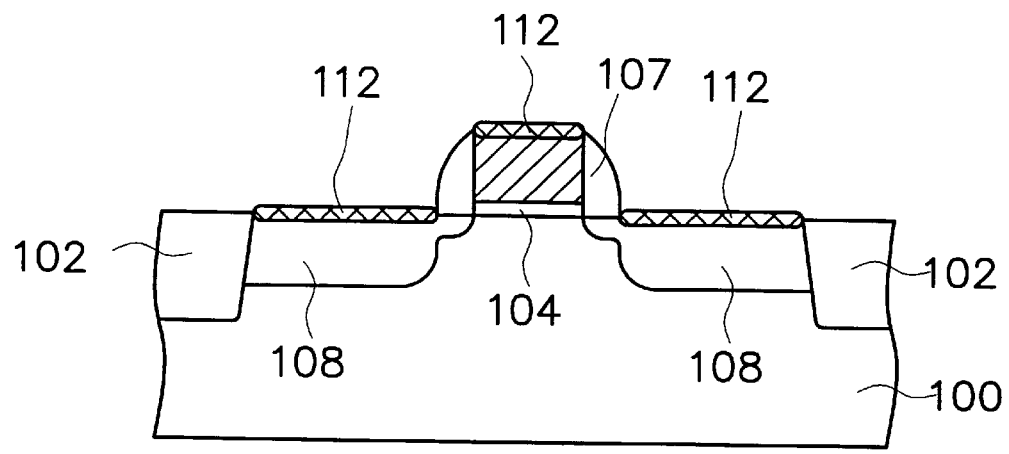

A chemical vapor deposition process, and especially a selective deposition on the source/drain and the gate, become important for future ULSI devices. FIGS. 1A–1C are cross-sectional views of a portion of a substrate, schematically illustrating a method of forming a silicide layer on the substrate, according to a preferred embodiment of the invention.

Referring to FIG. 1A, a semiconductor substrate 100 includes an isolation structure 102, such as a shallow trench isolation (STI) structure. A metal-oxide semiconductor (MOS) transistor including a polysilicon gate 106, a gate oxide layer 104, and an interchangeable source/drain region 108 is also formed on an active area between the isolation structure 102.

A spacer 107 is also formed on each sidewall of the polysilicon gate 106 and the gate oxide layer 104 in order to form the interchangeable source/drain region 108 with a lightly doped drain (LDD) structure, which is well known conventional process. The spacer 107 also serves as an isolation structure when a silicide layer is formed, later.

Referring to FIG. 1B, a metal layer 110 is formed on the substrate 100, including the source/drain region 108, space 107 and polysilicon gate 106, by chemical vapor deposition, for example, plasma enhanced chemical vapor deposition, low pressure chemical vapor deposition, or other chemical vapor deposition method. For example, if the metal layer 110 is formed of titanium, then $TiCl_4$ gas is used in the deposition process as a source gas with a deposition temperature at a temperature of between 550° C. and 750° C. A silicide layer 112, for example, a titanium silicide layer, is formed by triggering a reaction between the metal layer 110 and silicon in the substrate 100 and polysilicon gate 106 in the deposition procedure of the metal layer 110. That is, parts of the metal layer 110 are transformed into the silicide, in situ. The metal layer 110 is composed of titanium, tungsten, cobalt, nickel, molybdenum, or platinum, hence the silicide layer 112 is a titanium silicide, tungsten silicide, cobalt silicide, nickel silicide, molybdenum silicide, or platinum silicide, respectively. The source gas used for the deposition process depends on the property of the metal layer 110. The silicide layer 112 is called a salicide layer.

Referring to 1C, a remaining unreacted portion of the metal layer 110 without reaction is removed by, for example, wet etching with hydrogen peroxide ($H_2O_2$) water and ammonium hydroxide ($NH_4OH$) solution. The spacer 107 serves as an isolation structure between a portion of the silicide layer 112 on the polysilicon gate 106 and a portion of the silicide layer on the interchangeable source/drain region 108.

One feature of the invention is the in situ formation of the silicide layer by chemical vapor deposition. Therefore, no additional process and time are needed to react the metal layer with silicon in the substrate. Furthermore, a high quality silicide layer is formed even when the dimensions of the devices are reduced.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming salicide, comprising the steps of:

providing a substrate having a MOS device formed thereon, the MOS device including at least silicon contacting surfaces of a polysilicon gate and a source/drain region; and using chemical vapor deposition to form in situ a salicide layer on the silicon containing surfaces of the polysilicon gate and the source/drain region, wherein the chemical vapor deposition uses a reacting source gas to trigger a reaction in situ on the silicon containing surfaces to form the salicide layer.

2. A method according to claim 1, wherein the salicide layer comprises titanium silicide.

3. A method according to claim 1, wherein the source gas comprises $TiCl_4$.

4. A method according to claim 1, wherein the chemical vapor deposition is performed at a temperature of between 550° C. and 750° C.

5. A method of forming salicide, comprising the steps of:

providing a substrate having a MOS device formed thereon, the MOS device including at least silicon contacting surfaces of a polysilicon gate and a source/drain region; and using a chemical vapor deposition to form a metal layer on the silicon containing surfaces of the polysilicon gate and the source/drain region, wherein the metal layer in situ transforms into a salicide layer and the chemical vapor deposition process uses a reacting source gas to trigger a reaction in situ on the silicon containing surfaces to form the salicide layer.

6. A method according to claim 5, wherein the salicide layer comprises titanium silicide.

7. A method according to claim 5, wherein the source gas comprises $TiCl_4$.

8. A method according to claim 5, wherein the chemical vapor deposition is performed at a temperature of between 550° C. and 750° C.

* * * * *